United States Patent [19]

Nagano

[11] Patent Number: 5,357,056
[45] Date of Patent: Oct. 18, 1994

[54] CHIP CARRIER FOR OPTICAL DEVICE

[75] Inventor: Tuyosi Nagano, Tokyo, Japan

[73] Assignee: NEC Corporation, Tokyo, Japan

[21] Appl. No.: 35,949

[22] Filed: Mar. 23, 1993

[30] Foreign Application Priority Data

Mar. 23, 1992 [JP] Japan .................................. 4-64818
Aug. 27, 1992 [JP] Japan ................................. 4-228120

[51] Int. Cl.⁵ ............................................ H01L 23/02
[52] U.S. Cl. ................................... 174/52.4; 257/680
[58] Field of Search ............... 174/52.1, 52.4, 52.2, 174/52.3; 257/680, 681

[56] References Cited

U.S. PATENT DOCUMENTS 4,961,105 10/1990 Yamamoto ......................... 174/52.4

FOREIGN PATENT DOCUMENTS 56-69842 6/1981 Japan .................................. 257/680

OTHER PUBLICATIONS

Nikkei Electronics, No. 534, Aug. 19, 1991, pp. 100–101.

Primary Examiner—Leo P. Picard
Assistant Examiner—Christopher Horgan
Attorney, Agent, or Firm—Sughrue, Mion, Zinn, Macpeak & Seas

[57] ABSTRACT

A chip carrier for an optical device according to the present invention has a carrier body of insulating material, an external electrode, a glass cover fixed on one end of the carrier body, and a metal cover fixed on the other end of the carrier body. The optical device is connected at an electrode thereof to an inside end of the external electrode by a flip-chip bonding.

9 Claims, 7 Drawing Sheets

CHIP CARRIER FOR OPTICAL DEVICE

FIELD OF THE INVENTION

This invention relates to a chip carrier for an optical device, and more particularly, to a chip carrier for protecting an optical device such as a photodiode, a laser diode, a mirror, etc.

BACKGROUND OF THE INVENTION

One of conventional chip carriers for optical functional devices is described as a flat package for a laser coupler in an article entitled "Thin type optical pickup in which an optical system including a semiconductor laser is mounted on an actuator", on pages 100 and 101 in a journal "Nikkei Electronics", No. 534, 1991.

The conventional chip carrier includes a carrier body of insulating material, an external electrode connected to the laser coupler by a bonding wire, a transparent cover provided on one side of the carrier body, and a heat-dissipating plate provided on the other side of the carrier body.

In the conventional chip carrier, the laser coupler is electrically connected through the bonding wire and the external electrode to an external device, and is optically coupled through the transparent cover to an external device.

According to the conventional chip carrier, however, there are disadvantages in that a signal to be supplied to or from the laser coupler is attenuated due to a stray capacitance of the bonding wire and noise is included in the signal because the bonding wire acts as an antenna. Further, the chip carrier is large in size, because the external electrode is required to be located having a sufficient distance from the laser coupler. Furthermore, it is difficult to adjust the distance between the laser coupler and the transparent cover, so that the optical characteristics such as a focal distance of the optical device is unstable. As a result, it is difficult to use the chip carrier in combination with other optical devices.

SUMMARY OF THE INVENTION

Accordingly, it is an object of the invention to provide a chip carrier for an optical device which is small in size.

It is another object of the invention to provide a chip carrier for an optical device in which a distance between an optical device and a transparent cover can be adjusted precisely.

It is a further object of the invention to provide a chip carrier for an optical device in which an electric signal can be delivered effectively.

According to the invention, a chip carrier for an optical device includes:

a carrier body of insulating material, the carrier body having a light-through aperture;

an external electrode for electrically connecting the optical device to an external device, the external electrode having an inside end projected to an inside of the carrier body;

a conductive spot member arranged between an electrode of the optical device and the inside end of the external electrode for connecting them by a flip-chip bonding;

a transparent cover provided to cover the light-through aperture through which a light is transmitted so that the optical device is optically coupled to an external device therethrough; and a metal cover for sealing the optical device in the carrier body.

The other objects and features of the invention will become understood from the following description with reference to the accompanying drawings.

DESCRIPTION OF THE PREFERRED EMBODIMENTS

For better understanding of the background of the present invention, the basic principle of the conventional technology is first described hereinafter with reference to FIGS. 1A and 1B.

Figure 1A:
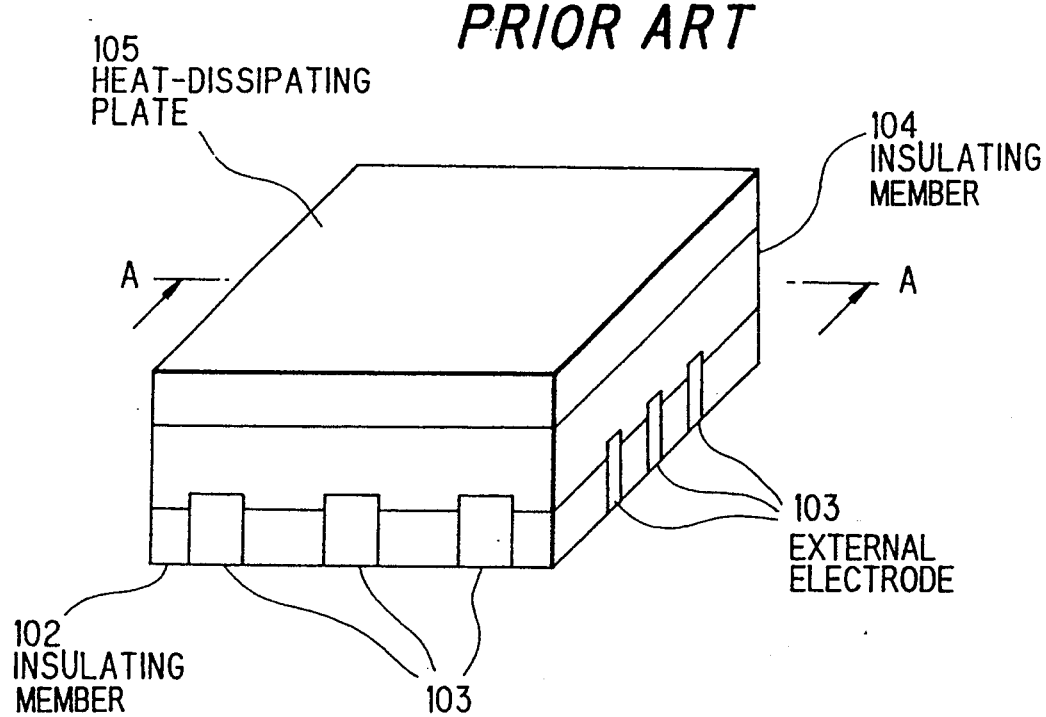
FIG. 1A is a perspective view showing a conventional chip carrier.
Figure 1B:
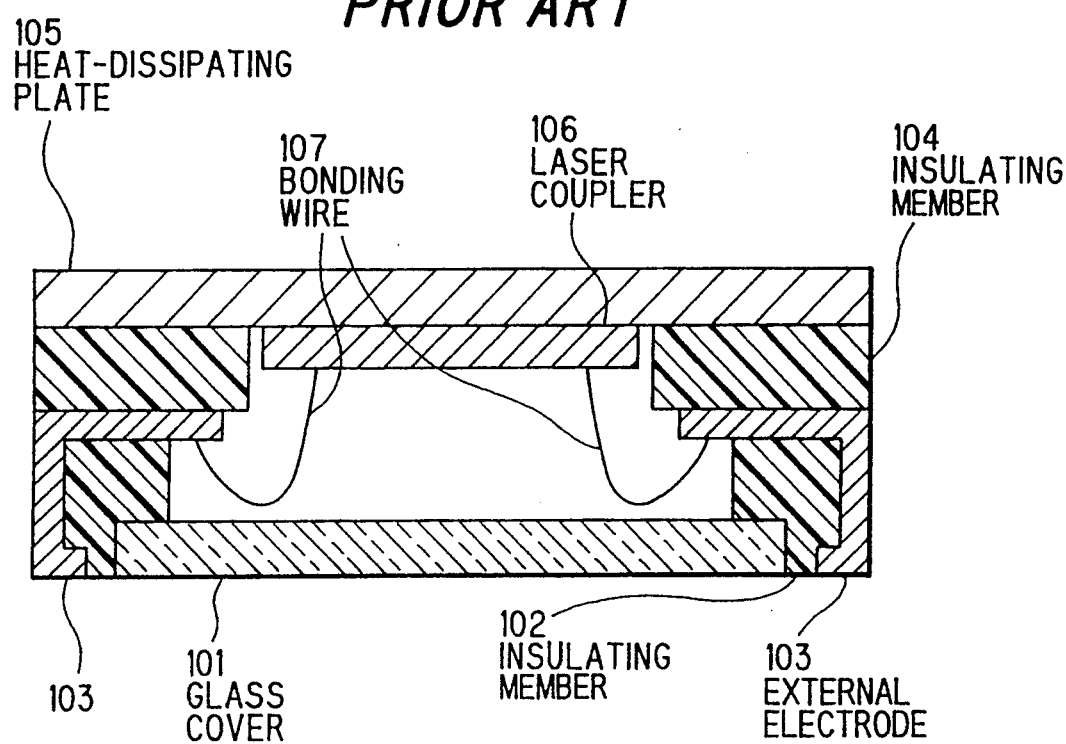
FIG. 1B is a cross-sectional view taken on line A—A of FIG. 1.

FIGS. 1A and 1B show a conventional chip carrier for a laser coupler 106. The conventional chip carrier includes a glass cover 101, external electrodes 103 to be connected to an external device (not shown), an insulating member 102 for insulating the external electrodes 103 from each other, a heat-dissipating plate 105 for the laser coupler 106, and an insulating member 104 formed between the electrodes 103 and the heat-dissipating plate 105.

In FIGS. 1A and 1B, the laser coupler 106 is shown as an IC photodiode, in which details are omitted from being shown, for easy explanation. The laser coupler 106 is electrically connected to the external electrodes 103 by bonding wires 107, and is optically coupled through the glass cover 101 to an external device.

In fabrication, a hollow body is fabricated by the insulating member 102, the external electrodes 103, the insulating member 104 and heat-dissipating plate 105, and the laser coupler 106 is fixed on an inner surface of the heat-dissipating plate 105. Next, the laser coupler 106 is bonded to the external electrodes 103 by the bonding wires 107. After that, the glass cover 101 is fixed to the insulating member 102 with adhesive of synthetic resin to seal the laser coupler 106 in the chip carrier.

According to the conventional chip carrier, however, there are disadvantages in that an electric signal can not be delivered to the laser coupler 106 effectively due to a stray capacitance of the bonding wires 107 as described before. Further, the chip carrier is large in size, and the optical characteristics of the laser coupler 106 is unstable as described before.

Figure 2:
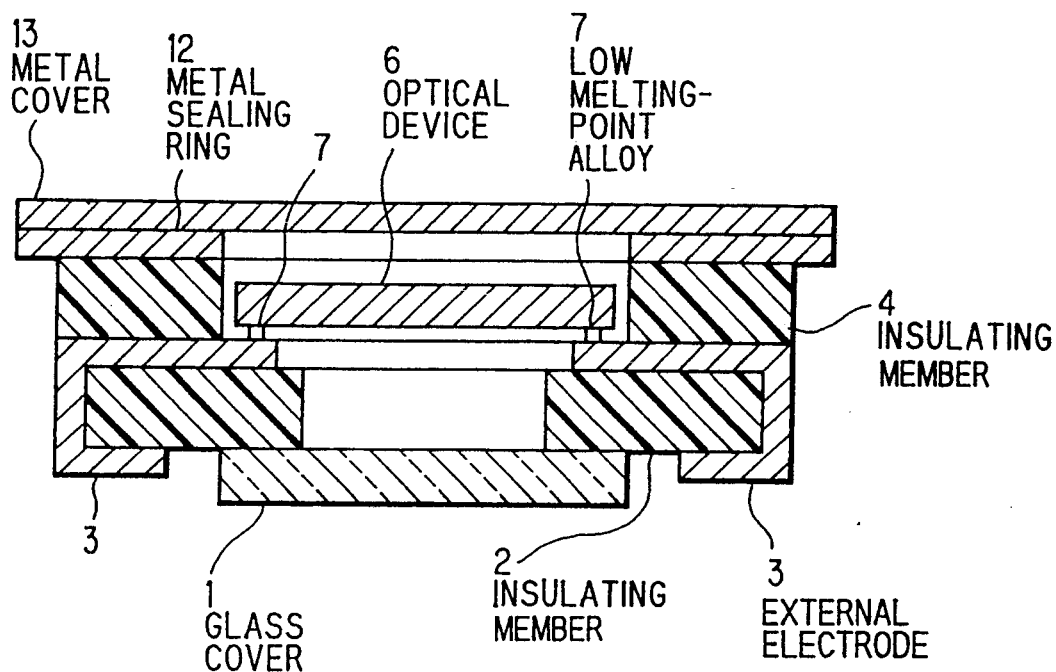
FIG. 2 is a cross-sectional view showing a chip carrier of a first preferred embodiment according to the invention.

FIG. 2 shows a chip carrier for an optical device 6 of a first preferred embodiment according to the invention. The chip carrier includes a glass cover 1, an insulating member 2 on which the glass cover 1 is fixed, external electrodes 3 formed on an outer surface of the insulating member 2, an insulating member 4, a metal sealing ring 12 mounted on the insulating member 4, and a metal cover 13 mounted on the metal sealing ring 12.

The optical device 6 is connected through low melting-point alloy 7 to the external electrodes 3 by a flip-chip bonding. One surface of the optical device 6, to or from which a light is supplied, faces to the glass cover 1. Each of the external electrodes 3 and the low melting-point alloy 7 is formed to have a thickness which is much thinner than that of the insulating member 2.

In fabrication, a hollow carrier body is fabricated by the glass cover 1, the insulating member 2, the electrodes 3, the insulating member 4 and the metal sealing ring 12. Next, the optical device 6 is connected through the low melting-point alloy 7 to the external electrodes 3 by a flip-chip bonding. After that, the metal cover 13 is mounted on the sealing ring 12 and is welded thereto so that the optical device 6 is sealed in the carrier.

In the chip carrier, conductive paste such as silver paste and cream solder may be used for connecting the optical device 6 to the electrodes 3 instead of the low-melting point alloy 7.

According to the first preferred embodiment, the chip carrier is easily fabricated with high precision in distance between the optical device 6 and the glass cover 1, because the optical device 6 is mounted in the chip carrier by a flip-chip bonding.

Next, chip carriers of second to eleventh preferred embodiments according to the invention will be explained in conjunction with FIGS. 3 to 11 and 12A and 12B. In this explanation, the same structure as the first preferred embodiment shown in FIG. 2 is omitted, and like parts are indicated by like reference numerals, as used in that of the first preferred embodiment.

Figure 3:
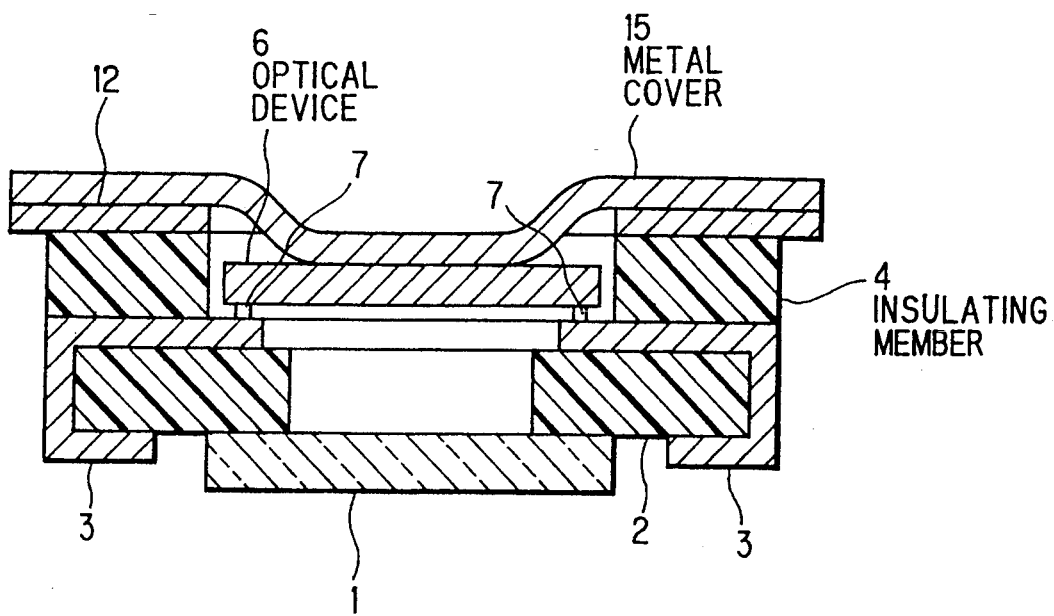
FIG. 3 is a cross-sectional view showing a chip carrier of a second preferred embodiment according to the invention.

FIG. 3 shows a chip carrier of a second preferred embodiment according to the invention, which includes a glass cover 1, an insulating member 2, external electrodes 3, an insulating member 4, a sealing ring 12 and a metal cover 15. The metal cover 15 is shaped to be contacted with the optical device 6 by pressing an outer surface thereof in a direction to the optical device 6. Therefore, the chip carrier has a heat-dissipating efficiency higher than that of the first preferred embodiment shown in FIG. 2.

Figure 4:
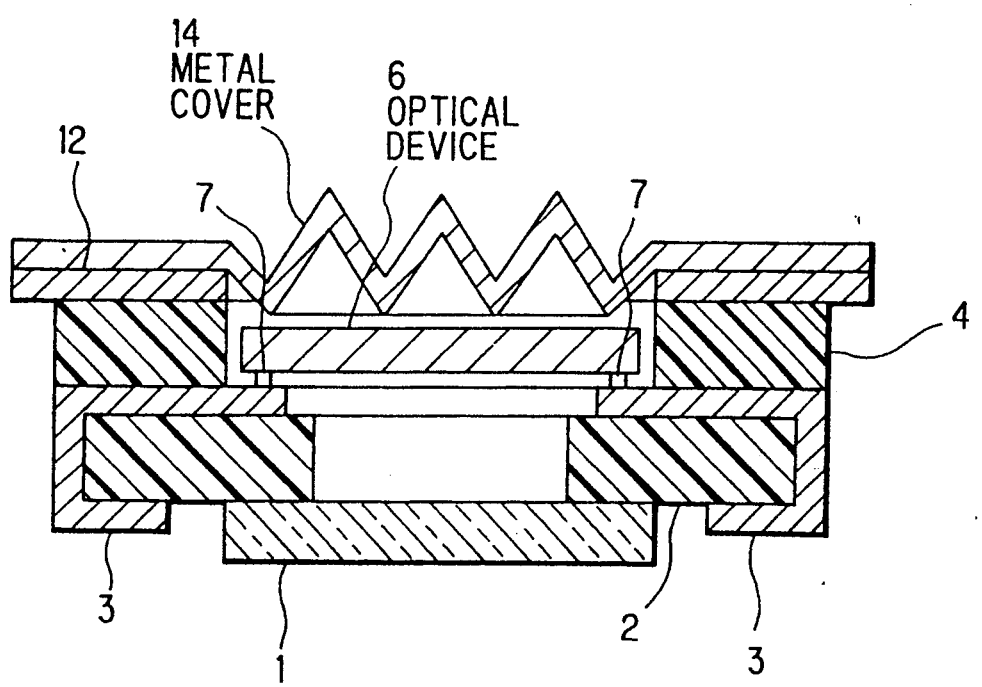
FIG. 4 is a cross-sectional view showing a chip carrier of a third preferred embodiment according to the invention.

FIG. 4 shows a chip carrier of a third preferred embodiment according to the invention, which includes a glass cover 1, an insulating member 2, external electrodes 3, an insulating member 4, a sealing ring 12 and a metal cover 14. The metal cover 14 is shaped wavy to increase the surface area. Therefore, the chip carrier has a heat-dissipating efficiency higher than that of the first preferred embodiment shown in FIG. 2.

Figure 5:
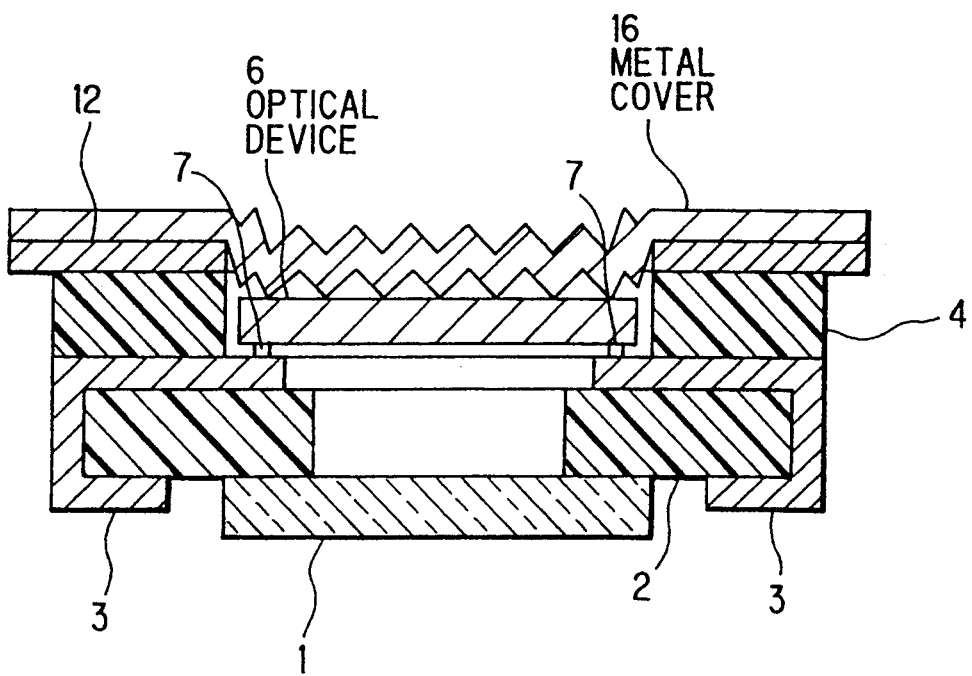
FIG. 5 is a cross-sectional view showing a chip carrier of a fourth preferred embodiment according to the invention.

FIG. 5 shows a chip carrier of a fourth preferred embodiment according to the invention, which includes a glass cover 1, an insulating member 2, external electrodes 3, an insulating member 4, a sealing ring 12 and a metal cover 16. The metal cover 16 has a wave pattern which is shaped with shorter pitch, and the metal cover 16 is contacted at some area with the optical device 6. Therefore, the chip carrier has a heat-dissipating efficiency higher than that of the third preferred embodiment shown in FIG. 4.

Figure 6:
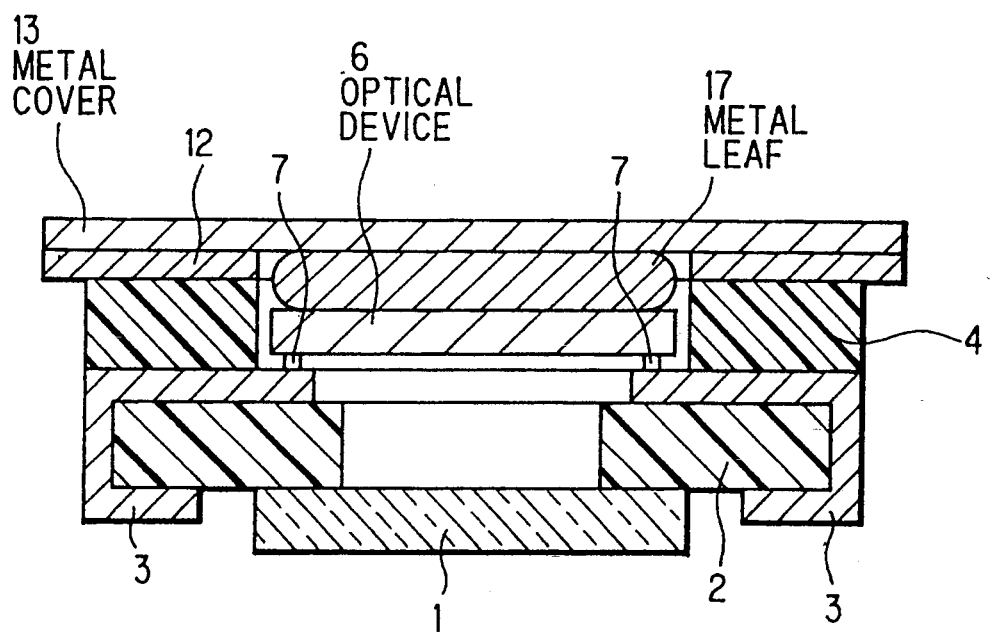
FIG. 6 is a cross-sectional view showing a chip carrier of a fifth preferred embodiment according to the invention.

FIG. 6 shows a chip carrier of a fifth preferred embodiment according to the invention, which includes a glass cover 1, an insulating member 2, external electrodes 3, an insulating member 4, a sealing ring 12, a metal cover 13 and a metal leaf 17. The metal leaf 17 is provided between the optical device 6 and the metal cover 13. In this embodiment, a thin film of organic material such as vinyl or polyimide may be used instead of the metal leaf 17.

According to the fifth preferred embodiment, heat generated at the optical device 6 is dissipated through the metal leaf 17 and the metal cover 13 to the outside, so that the heat-dissipating efficiency becomes higher than that of the first preferred embodiment shown in FIG. 2. Further, if some pressure is added on this chip carrier, load to be applied to the metal sealing ring 12 is dispersed to the metal leaf 17, so that a sealing reliability of the chip carrier is improved.

Figure 7:
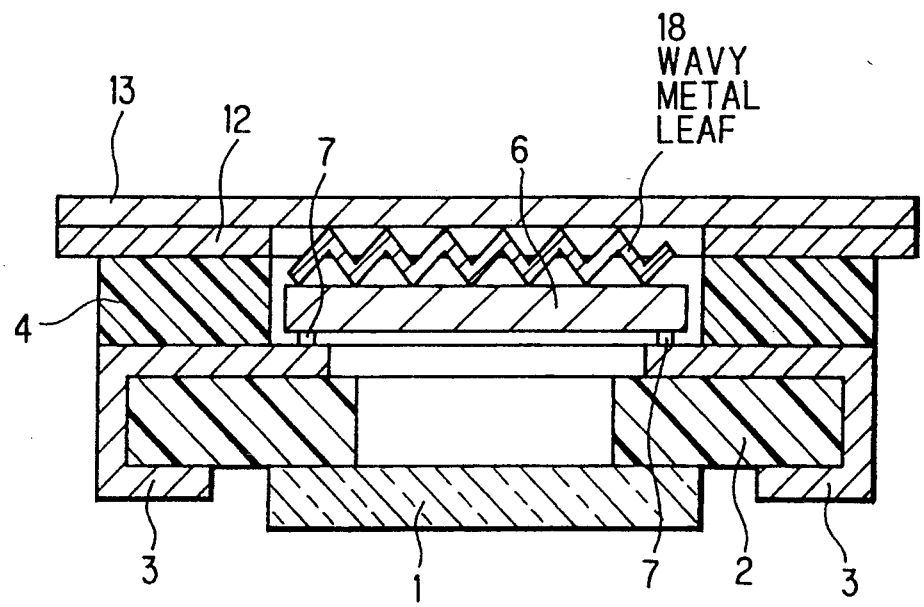
FIG. 7 is a cross-sectional view showing a chip carrier of a sixth preferred embodiment according to the invention.

FIG. 7 shows a chip carrier of a sixth preferred embodiment according to the invention, which includes a glass cover 1, an insulating member 2, external electrodes 3, an insulating member 4, a sealing ring 12, a metal cover 13 and a wavy metal leaf 18. The wavy metal leaf 18 is provided between the optical device 6 and the metal cover 13.

Figure 8:
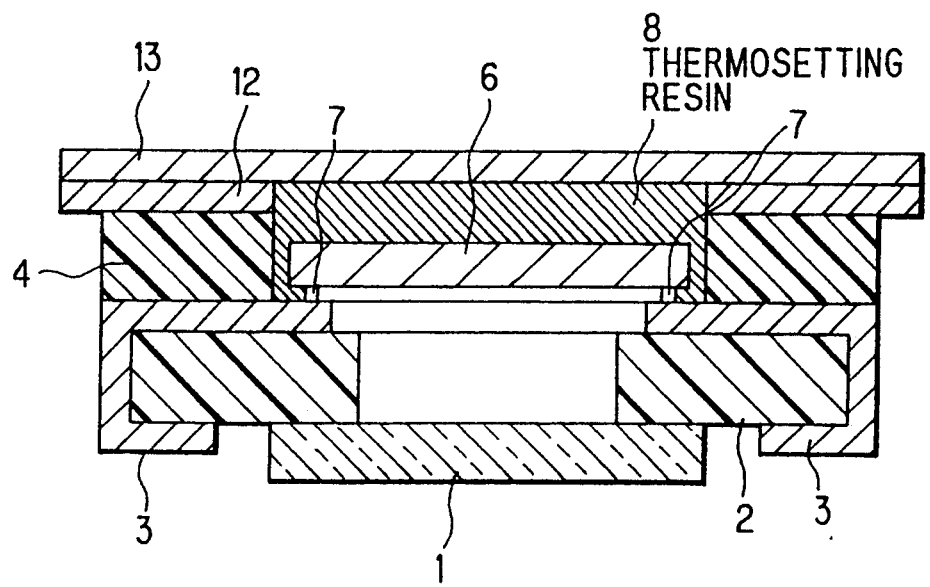
FIG. 8 is a cross-sectional view showing a chip carrier of a seventh preferred embodiment according to the invention.

FIG. 8 shows a chip carrier of a seventh preferred embodiment according to the invention, which includes a glass cover 1, an insulating member 2, external electrodes 3, an insulating member 4, a sealing ring 12, a metal cover 13 and thermosetting resin 8. The thermosetting resin 8 is formed around the optical device 6 so that a space between the optical device 6 and the metal cover 13 is filled therewith.

In fabrication, the metal cover 13 is welded to the metal sealing ring 12 after filling the thermosetting resin 8 between the optical device 6 and the metal cover 13. And then, the chip carrier is heated so that the thermosetting resin 8 is hardened.

Figure 9:
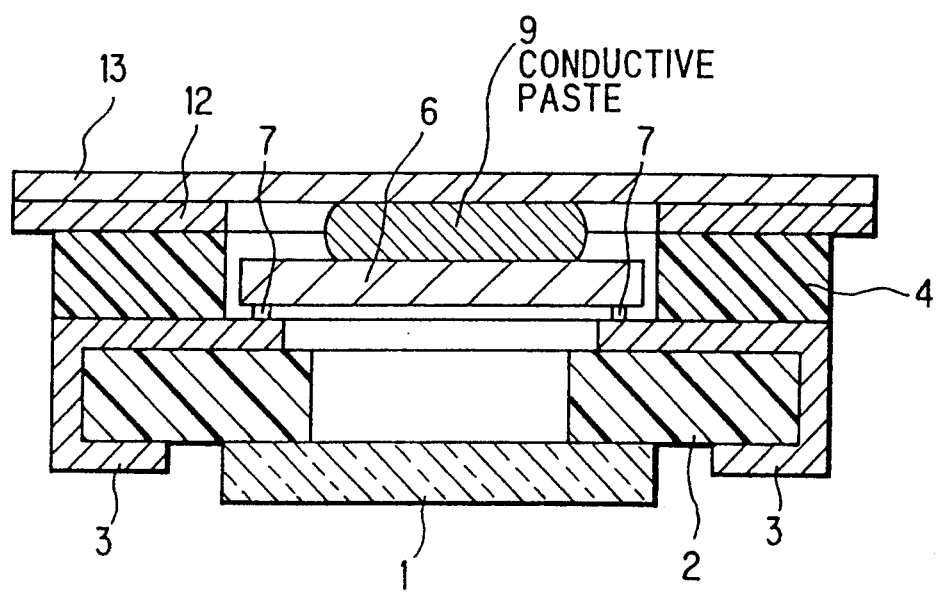
FIG. 9 is a cross-sectional view showing a chip carrier of an eighth preferred embodiment according to the invention.

FIG. 9 shows a chip carrier of an eighth preferred embodiment according to the invention, which includes a glass cover 1, an insulating member 2, external electrodes 3, an insulating member 4, a sealing ring 12, a metal cover 13 and conductive paste 9 formed between the optical device 6 and the metal cover 13.

In fabrication, the metal cover 13 is welded to the metal sealing ring 12 after filling the conductive paste 9 between the optical device 6 and the metal cover 13. And then, the chip carrier is heated to harden the conductive paste 9. In this embodiment, the conductive paste 9 is required to be formed so as not to contact the external electrodes 3 in order to avoid insulation failure, because the conductive paste 9 has a conductivity as compared to the thermosetting resin 8 which is not conductivity.

Figure 10:
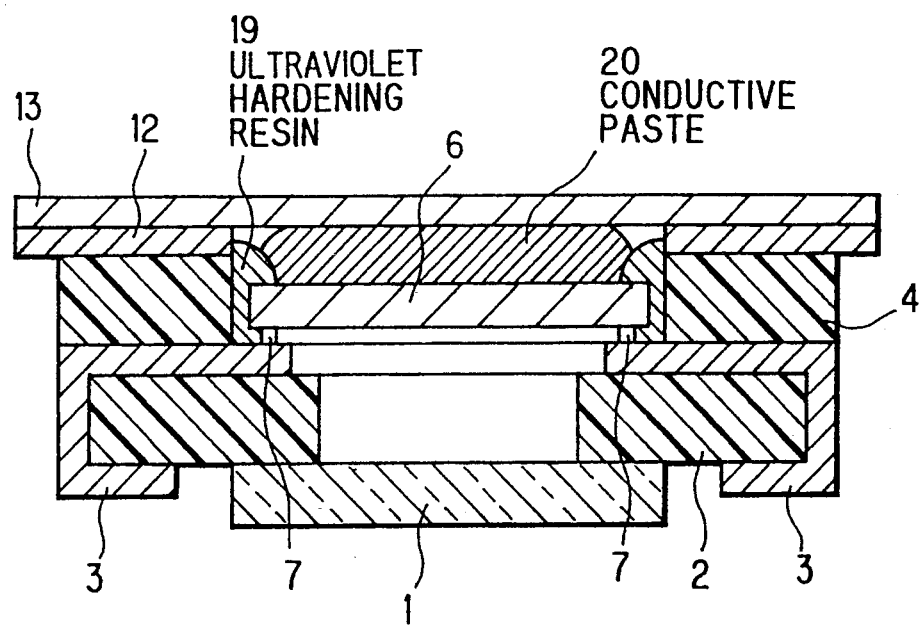
FIG. 10 is a cross-sectional view showing a chip carrier of a ninth preferred embodiment according to the invention.

FIG. 10 shows a chip carrier of a ninth preferred embodiment according to the invention, which includes a glass cover 1, an insulating member 2, external electrodes 3, an insulating member 4, a sealing ring 12, a metal cover 13, conductive paste 20 formed between the optical device 6 and the metal cover 13, and an ultraviolet hardening resin 19 formed around the optical device 6.

In fabrication, the ultraviolet hardening resin 19 is arranged between the optical device 6 and an insulating member 4, and then, ultraviolet rays are directed at the ultraviolet hardening resin 19 to harden it. Next, the conductive paste 20 is filled between the optical device 6 and the metal cover 13, and then the metal cover 13 is welded to the metal sealing ring 12. After that, the chip carrier is heated to harden the conductive paste 20.

According to the ninth preferred embodiment, the conductive paste 20 is insulated from the external electrodes 3 by the ultraviolet hardening resin 19, so that insulation reliability becomes higher than that of the eighth preferred embodiment shown in FIG. 9.

Figure 11:
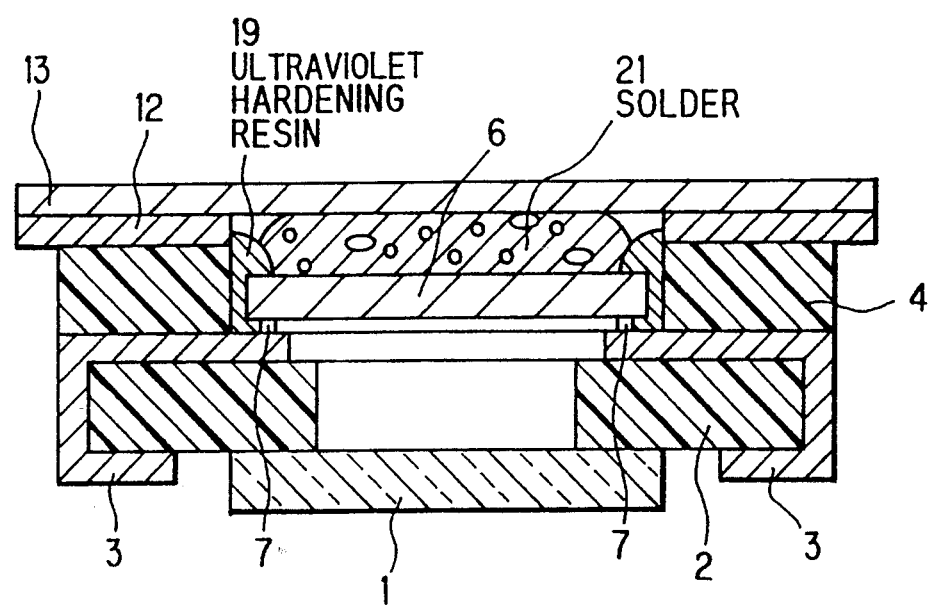
FIG. 11 is a cross-sectional view showing a chip carrier of a tenth preferred embodiment according to the invention.

FIG. 11 shows a chip carrier of a tenth preferred embodiment according to the invention, which includes a glass cover 1, an insulating member 2, external electrodes 3, an insulating member 4, a sealing ring 12, a metal cover 13, solder 21 formed between the optical device 6 and the metal cover 13, and an ultraviolet hardening resin 19 formed around the optical device 6.

In fabrication, the ultraviolet hardening resin 19 is arranged between the optical device 6 and the insulating member 4, and then, ultraviolet rays are directed at the ultraviolet hardening resin 19 to harden it. Next, grain solder is arranged between the optical device 6 and the metal cover 13, and then, the metal cover 13 is welded to the metal sealing ring 12. After that, the chip carrier is heated to melt the solder grain to fill between the optical device 6 and the metal cover 13 with solder 21.

According to the tenth preferred embodiment, the chip carrier is improved in heat-dissipating efficiency relative to the ninth preferred embodiment shown in FIG. 10, because the solder 21 has a thermal conductivity higher than that of the conductive paste 20.

Figure 12A:
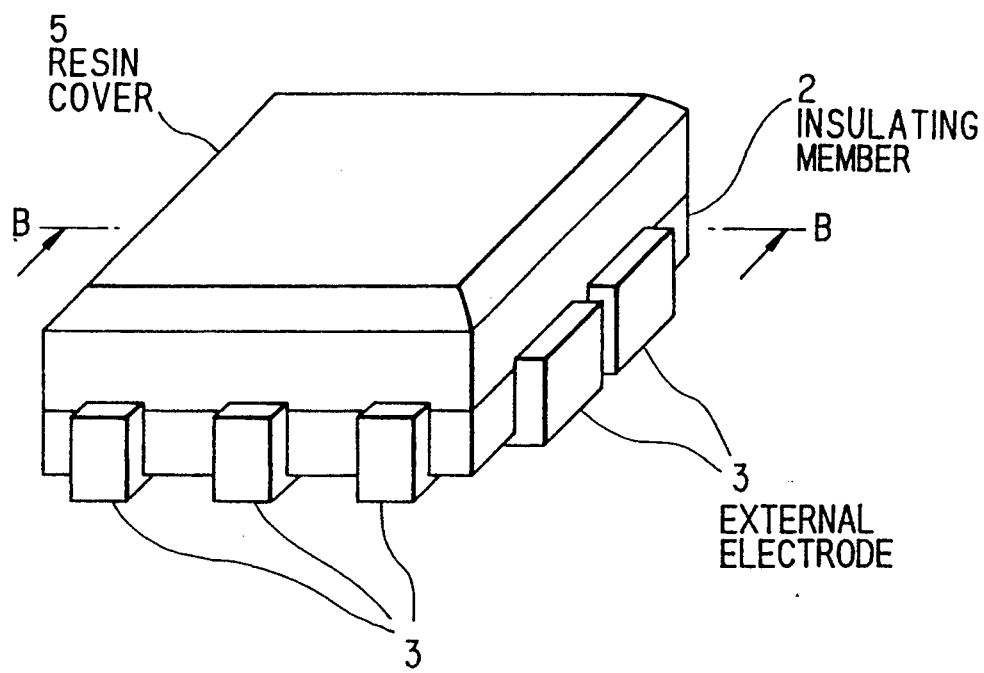
FIG. 12A is a perspective view showing a chip carrier of an eleventh preferred embodiment according to the invention.
Figure 12B:
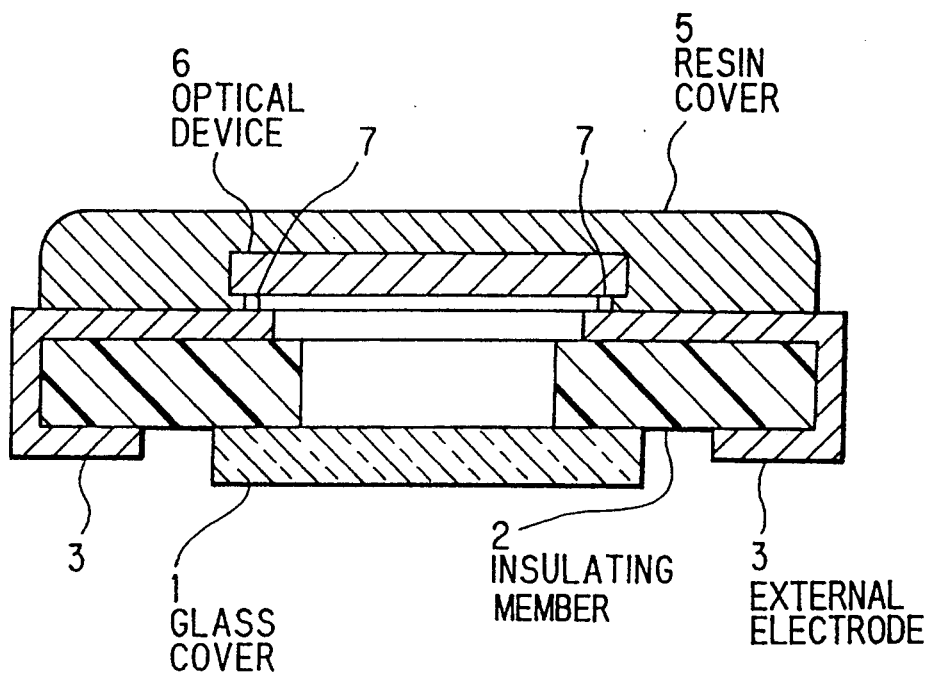
FIG. 12B is a cross-sectional view taken line B—B of FIG. 12A.

FIGS. 12A and 12B show a chip carrier of an eleventh preferred embodiment according to the invention. The chip carrier includes a glass cover 1, an insulating member 2, electrodes 3, and a resin cover 5. The resin cover 5 is formed around the optical device 6 at the last process of fabrication.

Although the invention has been described with respect to specific embodiment for complete and clear disclosure, the appended claims are not to be thus limited but are to be construed as embodying all modifications and alternative constructions that may be occur to one skilled in the art which fairly fall within the basic teaching herein set forth.

What is claimed is:

1. A chip carrier for an optical device, comprising:
   an insulating board with an aperture which is narrow enough to mount said optical device over said aperture on said insulating board and wide enough to optically couple said optical apparatus to an external device;
   a lead on said insulating board, said lead electrically connecting said optical device to said external apparatus,
   a conductive spot member arranged between said lead and an electrode of said optical device;
   a metal cover for sealing said optical device; and
   a transparent cover for sealing said aperture on a side of said insulating board opposite said optical device.

2. A chip carrier for an optical device, according to claim 1, wherein:
   said metal cover is depressed to be in contact with said optical device.

3. A chip carrier for an optical device, according to claim 1, wherein:
   said metal cover is shaped wavy.

4. A chip carrier for an optical device, according to claim 3, wherein:
   said metal cover, which is shaped wavy, has many wavy patterns with a small pitch to be in contact with said optical device at some portion.

5. A chip carrier for an optical device, according to claim 1, further comprising:
   a metal leaf provided between said optical device and said metal cover, said metal leaf being in contact with both of them.

6. A chip carrier for an optical device, according to claim 5, wherein:
   said metal leaf is shaped wavy.

7. A chip carrier for an optical device, according to claim 1, further comprising:
   conductive paste provided between said optical device and said metal cover, being in contact with both of them.

8. A chip carrier for an optical device, according to claim 7, further comprising:
   ultraviolet hardening resin provided between said optical device and said lead for insulating said conductive paste from said lead.

9. A chip carrier for an optical device, according to claim 1, further comprising:
   solder provided between said optical device and said metal cover; and
   ultraviolet hardening resin provided between said optical device and said lead for insulating said solder from said lead.

* * * * *